United States Patent
Mayer et al.

(10) Patent No.: US 11,036,410 B2
(45) Date of Patent: Jun. 15, 2021

(54) CLOCK CHARACTERISTIC DETERMINATION

(71) Applicant: Micron Technology, Inc., Boise, ID (US)

(72) Inventors: Peter Mayer, Neubiberg (DE); Martin Brox, Munich (DE); Wolfgang Anton Spirkl, Germering (DE); Marcos Alvarez Gonzalez, Munich (DE); Casto Salobrena Garcia, Munich (DE); Andreas Schneider, Maisach (DE)

(73) Assignee: Micron Technology, Inc., Boise, ID (US)

( * ) Notice: Subject to any disclaimer, the term of this patent is extended or adjusted under 35 U.S.C. 154(b) by 294 days.

(21) Appl. No.: 15/952,569

(22) Filed: Apr. 13, 2018

(65) Prior Publication Data

US 2019/0317683 A1  Oct. 17, 2019

(51) Int. Cl.
*G06F 12/00* (2006.01)
*G06F 3/06* (2006.01)
*G06F 1/04* (2006.01)

(52) U.S. Cl.
CPC .............. *G06F 3/0632* (2013.01); *G06F 1/04* (2013.01); *G06F 3/0613* (2013.01); *G06F 3/0673* (2013.01)

(58) Field of Classification Search
CPC ............................ G06F 3/0632; G06F 3/0613
See application file for complete search history.

(56) References Cited

U.S. PATENT DOCUMENTS

| | | | |
|---|---|---|---|
| 8,588,014 B1* | 11/2013 | Fung | H03K 5/131 365/194 |
| 9,741,403 B2 | 8/2017 | Wilson et al. | |
| 2003/0142566 A1* | 7/2003 | Sohn | G11C 29/14 365/201 |
| 2006/0242514 A1* | 10/2006 | Manning | G11C 29/022 714/727 |
| 2007/0299621 A1* | 12/2007 | Lew | G01R 31/3191 702/89 |
| 2008/0285636 A1* | 11/2008 | Sartschev | G01R 31/31709 375/224 |
| 2009/0307636 A1 | 12/2009 | Cases et al. | |
| 2017/0053711 A1* | 2/2017 | Shibata | G11C 29/38 |
| 2018/0268918 A1* | 9/2018 | Glancy | G11C 29/50012 |

* cited by examiner

*Primary Examiner* — Baboucarr Faal
(74) *Attorney, Agent, or Firm* — Brooks, Cameron & Huebsch, PLLC

(57) ABSTRACT

A method includes varying a number of clock characteristics of each a plurality of memory devices of a memory concurrently, determining a fitness of the memory for each variation of the number of clock characteristics, selecting a particular variation of the number of clock characteristics based on the determined fitness of the memory for the particular variation, changing a setting in each of the plurality of memory devices corresponding to the particular variation to generate an additional variation of the number of clock characteristics, and determining a fitness of the memory for the additional variation.

19 Claims, 3 Drawing Sheets

CLOCK CHARACTERISTIC DETERMINATION

TECHNICAL FIELD

The present disclosure relates generally to memories, and, more particularly, to clock characteristic determination.

BACKGROUND

In electronic devices, such as synchronous dynamic random access memory circuits (SDRAMs), microprocessors, digital signal processors, and so forth, the processing, storage, and retrieval of information is coordinated with a clock signal. The speed and stability of the clock signal determines to a large extent the data rate at which a circuit can function. Many high-speed integrated circuit devices, such as SDRAMs, microprocessors, etc., rely upon clock signals to control the flow of commands, data, addresses, etc., into, through and out of the devices.

DETAILED DESCRIPTION

Figure 1A:
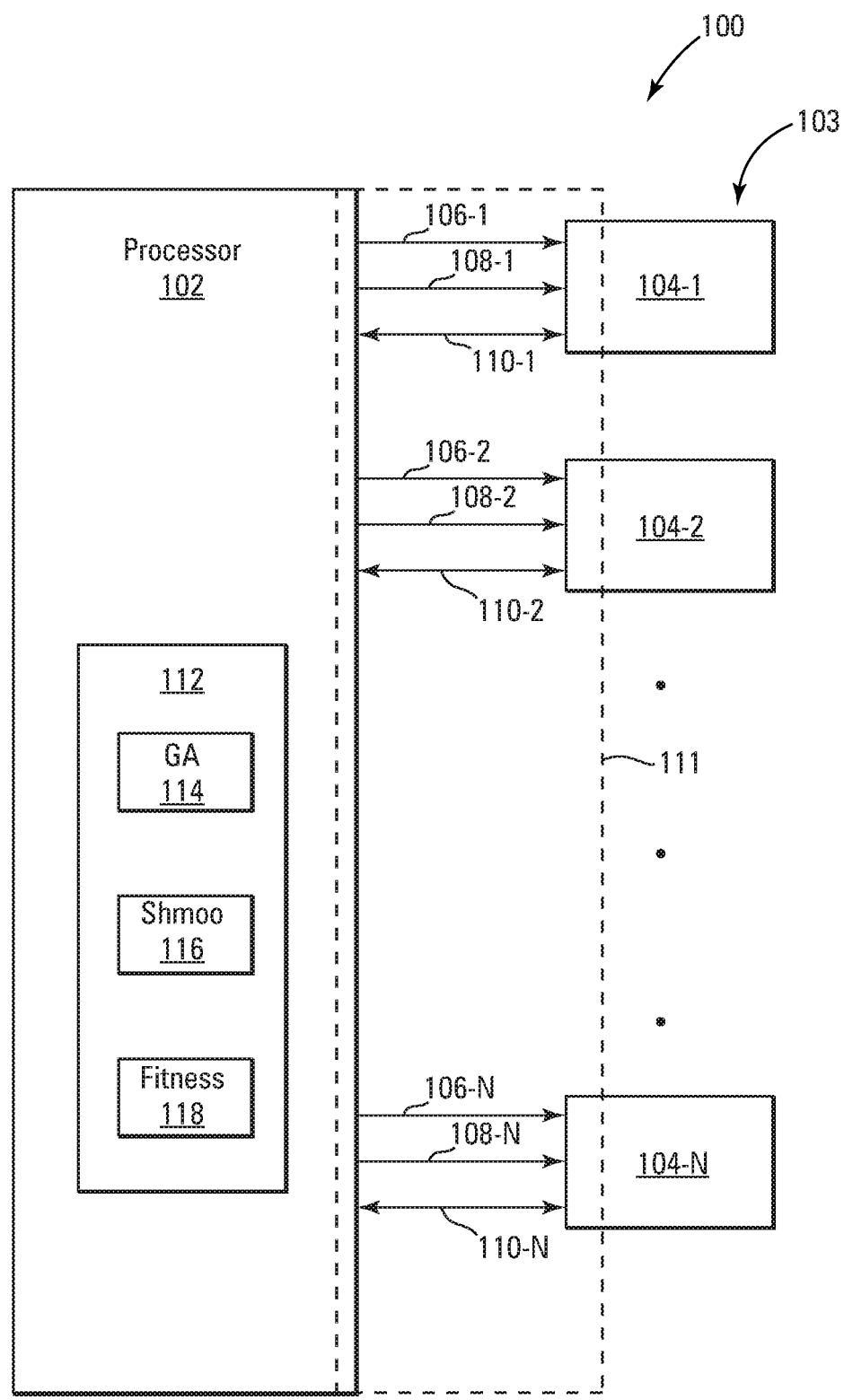
FIG. 1A is a block diagram of an apparatus configured to determine clock characteristics in accordance with a number of embodiments of the present disclosure.

The present disclosure is directed to technological improvements in memories and processors and the apparatuses (e.g., systems) that employ such memories and processors. The disclosed embodiments improve data transfer between a processor and a memory having a number of memory devices. For example, the disclosed apparatus result in larger data eyes compared to data eyes of previous approaches.

A data eye can be defined as a valid data window. For example, a data eye can correspond to an amount of time during which data can be reliably transferred to the processor from the memory. However, the size of the data eye may decrease as the data transfer rate between the memory and the processor increases, and eventually closes, making it difficult to reliably transfer data to the processor from the memory.

To compensate for reductions in the data eye size due to increased data rates, previous approaches have adjusted interface circuitry between the memory and processor and the timing of a strobe, that indicates to the processor when data is to be transferred between the memory and the processor, to better coincide with the data eye. However, these approaches have had limited (e.g., little or no) success at improving the reliability of the data transfer from the memory to the processor at higher data transfer rates.

The embodiments herein solve the problem reduced data eye size by increasing the data eye size relative to previous approaches by determining a particular clock characteristic for the memory devices, from a number of possible clock characteristics, that results in an increased data size.

In the disclosed embodiments, the fitness of the memory is determined for each of a number of possible clock characteristics of the memory devices of the memory, such as while operating the devices in test mode. A particular number of clock characteristics can then be selected from the number of possible clock characteristics based on the corresponding fitness. For example, two clock characteristics corresponding to fitnesses that can be greater than the fitnesses for other clock characteristics may be selected. Additional clock characteristics, such as a new generation of clock characteristics, may be generated from the selected clock characteristics. A fitness of the memory can then be determined for the additional clock characteristics. The fitness of the memory can be determined from the data eye. For example, the larger the data eye, the greater the fitness.

The additional clock characteristics may be generated by changing a number of settings of the selected clock characteristics. An additional clock characteristic may be a mutation of a selected clock characteristic or one of a pair of children of two selected clock characteristics. In some examples, additional generations of characteristics can be generated from preceding generations. A fitness of the memory may be determined for each generation. This allows a particular clock characteristic to be selected based on the fitness of the memory. In some examples, the clocks of the memory devices are set to the particular clock characteristic.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

FIG. 1A is a block diagram of an apparatus in the form of a computing system 100, in accordance with a number of embodiments of the present disclosure. For example, computing system 100 may be a graphics card among others. Computing system 100 includes a processor 102, such as a graphics processing unit (GPU) among others. Processor 102 is coupled to a memory 103 that includes memory components (e.g., memory devices) 104-1 to 104-N, such as memory chips. Memory devices 104-1 to 104-N may be synchronous DRAM memory devices among others, for example.

Memory devices 104-1 to 104-N can receive address signals (addresses) and command signals (commands) from processor 102 respectively over command/address buses 106-1 to 106-N. Memory devices 104-1 to 104-N can receive clock signals from processor 102 respectively over clock lines 108-1 to 108-N. Memory devices 104-1 to 104-N can receive data signals (e.g., data) from (e.g., during a write operation) and send data signals to (e.g., during a read operation) processor 102 respectively over data buses 110-1 to 110-N. In some examples, each of data buses 110-1 to 110-N can include 32 data lines, but the present disclosure is not so limited, and there can be other quantities of data lines in a data bus. In some examples, the command/address buses, clock lines, and data buses are part of an interface 111 configured to allow communication between processor 102 and memory 103.

Processor 102 includes a software component 112 that includes a genetic algorithm component 114, a shmoo component 116, and a fitness component 118. For example, genetic algorithm component 114, shmoo component 116, and a fitness component 118 configure processor 102 to determine clock characteristics of memory devices 104-1 to 104-N that improve the collective fitness of memory devices 104-1 to 104-N, and thus the fitness of memory 103, in accordance with a number of embodiments of the present invention.

Processor 102 is configured to vary a number of clock characteristics of each of memory devices 104-1 to 104-N concurrently. Fitness component 118 is configured to determine a fitness of memory 103 (e.g., a collective fitness of memory devices 104-1 to 104-N) for each variation of the number of clock characteristics and to determine a particular variation of the number of clock characteristics that corresponds to a fitness (e.g., a "best" fitness) that is greater than fitnesses corresponding to other variations of the number of clock characteristics. Genetic algorithm component 114 is configured implement a genetic algorithm to change a setting, such as a current setting, of clock characteristic of the particular variation to generate an additional variation of the number of clock characteristics. Fitness component 118 is configured to determine a fitness of the system for the additional variation.

In general, the genetic algorithm can be configured to determine a first generation of clock characteristics, as previously described, that includes the variation corresponding to the best fitness and a variation corresponding to the "next best" fitness that is less than the best fitness and greater than fitnesses corresponding to other variations of the number of clock characteristics. The genetic algorithm may then determine a second generation of characteristics from the first generation using genetic operators, such as mutation and crossover. For example, the genetic algorithm may create mutations of the variations corresponding to the best and the next best fitnesses and/or children, using crossover, of the variations corresponding to the best and the next best fitnesses. Processor 102 may then apply the mutations and/or children to memory 103, and fitness component 118 may then determine fitnesses corresponding mutations and/ or children. The genetic algorithm may continue to determine generations from preceding generations using the genetic operators until there are no appreciable changes in the fitness.

Figure 1B:
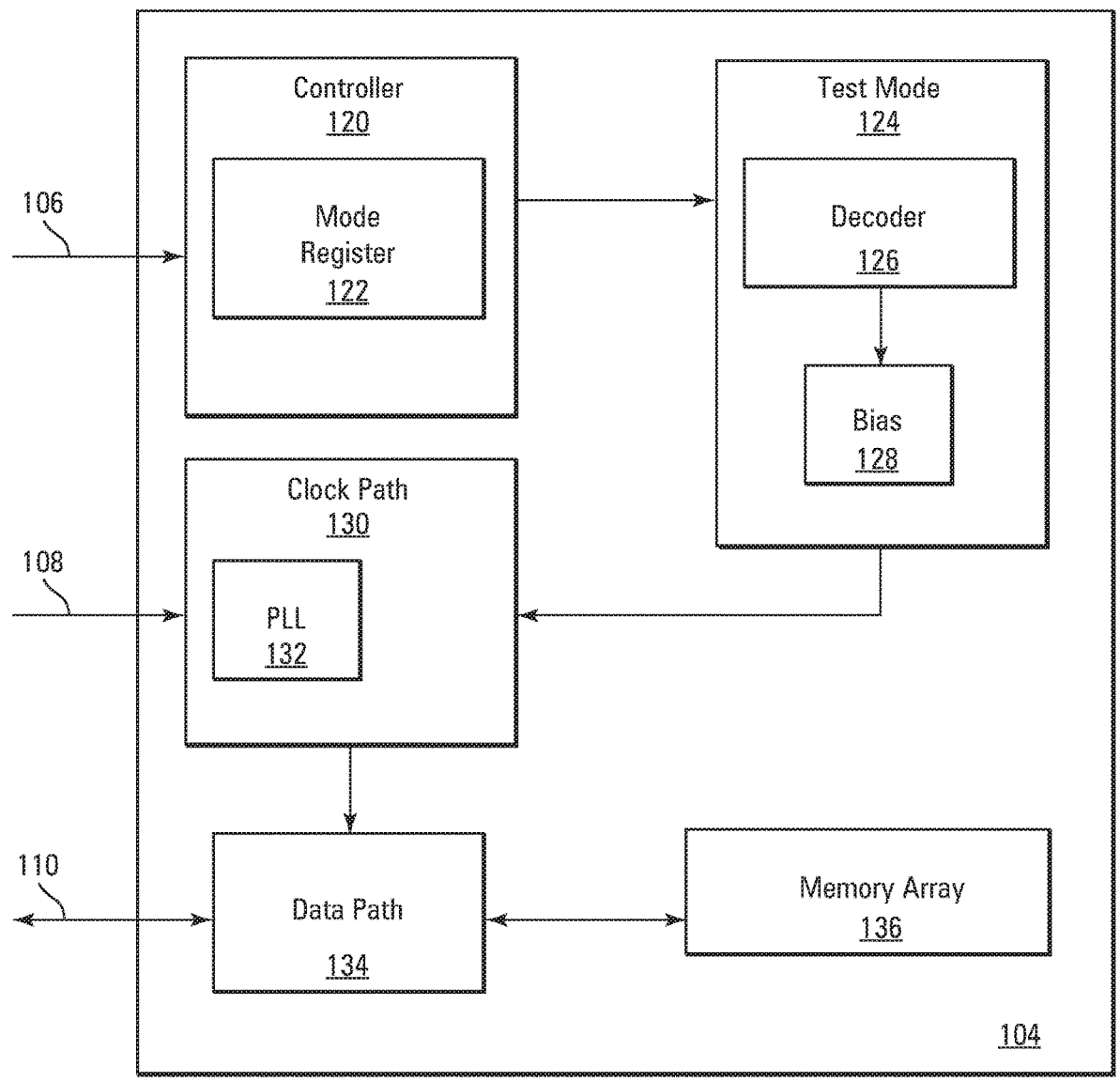
FIG. 1B is a block diagram illustration of a representative memory device, in accordance with a number of embodiments of the present disclosure.

FIG. 1B is a block diagram illustration of a representative memory device 104. For example, each of memory devices 104-1 to 104-N can be configured as shown in FIG. 1B. Memory device 104 includes a controller 120 configured to control operations of memory device 104. Controller 120 is configured to receive addresses and commands from processor 102 over command/address bus 106 and to decode the received addresses and commands.

Controller 120 includes a mode register 122. Mode register 122 is configured to receive a clock characteristic that includes a number (e.g., set) of settings, such as clock settings (e.g., clock bias currents) from processor 102 over command/address bus 106.

A test mode component 124 is coupled to controller 120 and includes a decoder 126 coupled to controller 120 and a biasing component 128 coupled to decoder 126. A clock path 130 that includes an internal clock, such as phase locked loop (PLL) 132, is coupled to test mode component 124 and to a data path 134 that is coupled to a memory array 136 of memory cells, such as DRAM memory cells among others.

Clock path 130, and thus PLL 132, receives an external clock signal from processor 102 over clock line 108. PLL 132 generates an internal clock signal responsive to the external clock signal for controlling the timing of operations of memory device 104. For example, the internal clock signal can control the timing of the output of data from data path 134 to processor 102 over data bus 110 during read operations. The internal clock signal can control the timing of data received at data path 134 from processor 102 over data bus 110 during write operations.

Processor 102 initiates a test mode operation in memory devices 104-1 to 104-N concurrently by sending a test mode command to the respective mode registers 122 of the respective memory devices 104-1 to 104-N over command/address buses 106-1 to 106-N. The respective controllers 120 in the respective memory devices 104-1 to 104-N place the respective memory devices 104-1 to 104-N in test mode in response to the test mode command. Processor 102 also sends a set of encoded clock settings to the respective mode registers 122 of the respective memory devices 104-1 to 104-N concurrently. For example, the encoded clock settings may be encoded as 1s and 0s. In some examples, the encoded clock settings may be part of the test mode command. The clock settings can be, for example, current settings, such as bias (e.g., trim) current settings of a clock characteristic.

The set of encoded clock settings can be sent to the respective test mode components 124 of respective memory devices 104-1 to 104-N, such as while the respective memory devices 104-1 to 104-N are in test mode. The decoders 126 of memory devices 104-1 to 104-N decode the encoded sets and send them to the e biasing components 128 of memory devices 104-1 to 104-N. The respective biasing components 128 apply the set of currents to the respective clock paths 130, and thus the respective PLLs 132, of respective memory devices 104-1 to 104-N. For example, the clock settings respectively correspond to and control clock a characteristic of the respective PLLs 132.

The respective controllers 120 execute a test mode operation (e.g., a test mode run) concurrently with the set of settings applied to the respective clock paths 130. During the test mode operation, memory devices 104-1 to 104-N perform read and write operations for a number of operating points specified by processor 102.

Each respective operating point may correspond to a respective reference voltage and a respective strobe timing. For example, the strobe timings can be strobe offsets relative to a particular strobe timing, such as a trained timing trained to correspond to approximately a middle of the data eye. For example, the strobe may indicate to processor 102 when the data is valid.

The operating points may be specified by shmoo component 116 and may correspond to entries in a shmoo diagram. For example, shmoo component 116 can generate a shmoo diagram for memory 103 (e.g., a collective shmoo diagram for memory devices 104-1 to 104-N as a whole) for the test mode operation. Shmoo component 116 may read memory 103 to determine a number errors (e.g. a number of failed bits) for each respective reference-voltage-strobe-timing coordinate of the shmoo diagram and enter the number of errors into a respective entry in the shmoo diagram. For example, an error can correspond to reading a bit value of 1 for a programmed bit of 0 or reading a bit value of 0 for a programmed bit of 1.

Figure 2:
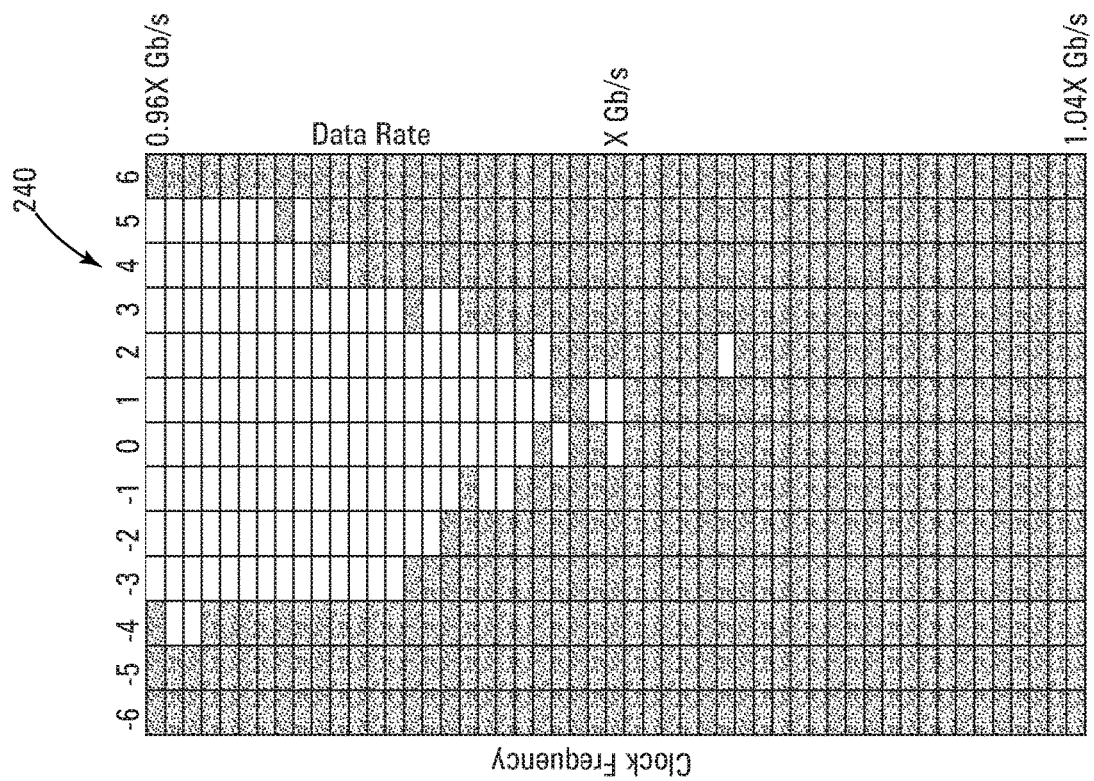
FIG. 2 illustrates an example of a shmoo diagram, in accordance with a number of embodiments of the present disclosure.

FIG. 2 illustrates an example of a shmoo diagram 240 that can be generated during a test mode operation, in accordance with a number of embodiments of the present disclosure. In shmoo diagram 240, the columns respectively correspond to different strobe timings, such as strobe offsets (e.g., time steps) relative to the zero (0) column. For example, the strobe offsets to the right of the zero column are positive, and the strobe offsets to the left of the zero column are negative. The zero column may correspond to a trained strobe timing. The rows correspond to different frequencies of a data clock, such as in clock path 130. Therefore, each respective entry (e.g., block) in shmoo diagram 240 corresponds to a respective operating point corresponding to a strobe offset and a data clock frequency.

During the test mode operation, memory 103 is read for each operating point in shmoo diagram 240, and the number of errors is entered in the corresponding block. In FIG. 2, the unshaded blocks have zero errors, whereas the shaded blocks have at least one error. The unshaded region corresponds to the read data eye for the test mode operation. The number of errors in the blocks have been omitted for simplicity.

Note that the data eye is closed in the shaded region. Processor 102 can reliably read the data from memory 103 for operating points corresponding to the data eye, but not where the data eye is closed.

The operating points having zero errors (e.g., the unshaded blocks) can be referred to as pass points. The number of pass points corresponds to the fitness of memory 130. For example, shmoo diagram 240 has 154 pass points, meaning memory 130 has a fitness of 154 for the clock settings that yielded shmoo diagram 240. Note that the number of pass points correlates with the size of the data eye, another indicator of the fitness, for example.

Interface training for each data line so the strobe occurs approximately in the center of the data eye and employing strobe offsets to better adjust when the strobe occurs, and other techniques, such as on die termination (ODT) and decision feedback equalization (DFE), have been employed in previous approaches to improve the fitness and increase the size of the data eye with limited (e.g., little or no) success. Embodiments of the present disclosure recognize that the fitness can be improved and that the size of the data can be increased by adjusting the internal clock characteristics of each of memory devices 104-1 to 104-N until a desired fitness of memory 103 is obtained.

PLL 132 can have a number of adjustable individual (e.g., clock) characteristics. Each respective individual characteristic can correspond to a respective individual set of a number of (e.g., of M) different currents that can be applied to PLL 132. Each respective current of a respective set can have a number of (e.g., J) different settings, such as current settings. This means that $J^M$ different sets of M different current settings can be applied to PLL 132. For example, each of the respective $J^M$ different sets can correspond to a respective individual characteristic of PLL 132, and each of the respective $J^M$ different sets can be a respective individual set of current settings that can be applied to PLL 132. For example, each respective individual set of current settings can be referred to as an individual that can be applied to PLL 132.

In an example, each of currents C1 to CM may respectively have settings (s1,1, s1,2, s1,3, . . . , s1,J) to (sM,1, sM,2, sM,3, . . . , sM,J). In a simplified example in which J=2 and M=3, current C1 may have settings s1,1 and s1,2; current C2 may have settings s2,1 and s2,2; and current C3 may have settings s3,1 and s3,2. The resulting eight individuals may be I1(s1,1, s2,1, s3,1), I2(s1,1, s2,2, s3,1), I3(s1,1, s2,1, s3,2), I4(s1,1, s2,2, s3,2), I5(s1,2, s2,1, s3,1), I6(s1,2, s2,2, s3,1), I7(s1,2, s2,1, s3,2), I8(s1,2, s2,2, s3,2). Each respective individual can produce a respective clock characteristic of PLL 132, for example.

However, PLLs can have numerous adjustable characteristics. For example, for a PLL with ten (10) adjustable currents, each having eight (8) settings, there are $8^{10}$ individuals, and thus $8^{10}$ characteristics, and it could take 100000 years to determine a fitness for each of the $8^{10}$ individuals, which is clearly unrealistic. The methods disclosed herein overcome this obstacle by employing a process (e.g., during test mode) that includes eliminating individuals from a set of individuals that do not work and performing a genetic algorithm on a remaining subset of the individuals to improve the fitness and increase the size of the data eye of memories compared to previous approaches. For example, the methods disclosed herein increase the size of the data eye depicted in FIG. 2 and the associated fitness.

A population of individuals can be determined by eliminating individuals for which memory 103 will not operate. For example, an original set of potential individuals may include individuals, such as at upper and lower extremes of the set, for which memory will not work. In some examples, these individuals can be eliminated by applying them to memory 130 during test mode operations to determine if memory 103 fails to operate. For example, each individual can be applied to the PLLs 132 memory devices 104-1 to 104-N concurrently. Any individual for which memory 103 fails operate is eliminated, thereby determining the population of individuals that is a subset of the original set.

A genetic algorithm can be employed to determine a desired individual from the determined population. In other examples, a reduced population may be used by the genetic algorithm. For example, the reduced population may include a random sample of the individuals in the determined population. In some examples, the determined population and/or the reduced population may include default individuals, such as individuals determined based on design guidance, and may include the individual the resulted in data eye 240.

In operation, for example, the genetic algorithm determines a fitness and/or data eye for memory 103 for each individual in the population while memory devices are operating in test mode 104-1 to 104-N concurrently. For example, the genetic algorithm causes processor 102 to send an encoded individual to the mode register 122 of each of memory devices 104-1 to 104-N concurrently. The respective decoder 126 of respective memory devices 104-1 to 104-N decodes the individual, and the respective bias component 128 of respective memory devices 104-1 to 104-N applies the decoded individual (e.g. the set of current settings of the decoded individual) to the respective PLL 132 of respective memory devices 104-1 to 104-N concurrently. Shmoo component 116 generates a shmoo diagram for memory 103 for the individual by causing memory devices 104-1 to 104-N to perform reads and writes for each entry (e.g., each strobe-offset-data-clock-frequency combination) of the shmoo diagram. For example, shmoo component 116 generates a read shmoo diagram for the individual and determines a number of bit errors for each entry of the diagram. Shmoo component 116 then determines the fitness and a data eye for memory 103 corresponding to (e.g., of) the individual from the number of pass points.

The genetic algorithm then selects a pair of individuals corresponding to fitnesses that are greater than other fitnesses corresponding to other individuals. For example, the fitnesses corresponding to the selected individuals may be referred to as the "best" fitness and the "next best" fitness, in that one of the fitnesses might be greater than the other. The selected individuals may be referred to as a first generation, for example. The first generation may include an individual I1(s1,1, s1,2, s1,3, s1,4, s1,5, . . . , s1,J) corresponding to the best fitness and an individual I2(s2,1, s2,2, s2,3, s2,4, s2,5, . . . , s2,J) corresponding to the next best fitness, for example.

The genetic algorithm may then generate a second generation (e.g., a number of additional) individuals from the first generation, for example, using genetic operators, such as mutation and crossover. A mutation may include randomly changing a number of settings in an individual from the first generation, such as the individual corresponding to the best fitness, to generate a mutation of that individual. For example, a mutation of an individual I1(s1,1, s1,2, s1,3, s1,4, s1,5, . . . , s1,J) can be mutation M1gen2(s1,1, s1,2, s1,3, s8, s1,5, . . . , s1,J) and a mutation of an individual I2(s2,1, s2,2, s2,3, s2,4, s2,5, . . . , s2,J) can be mutation M2gen2(s7, s2,2, s2,3, s2,4, s2,5, . . . , s2,J)

A crossover refers to generating children from the first generation by crossing some settings from the individuals I1 and I2. For example, one child may be generated by replacing some of the settings of individual I1 with some settings from individual I2. Another child may be generated by replacing some of the settings of individual I2 with some of the settings from individual I1. For example, children of individuals I1(s1,1, s1,2, s1,3, s1,4, s1,5, . . . , s1,J) and I2(s2,1, s2,2, s2,3, s2,4, s2,5, . . . , s2,J) may be child C1gen2(s2,1, s2,2, s1,3, s1,4, s1,5, . . . , s1,J) and child C2gen2(s1,1, s1,2, s2,3, s2,4, s2,5, . . . , s2,J). For example, settings s2,1 and s2,2 from individual I2 replace settings s1,1 and s1,2 of individual I1 to create child C1gen2, and settings s1,1 and s1,2 from individual I1 replace settings s2,1 and s2,2 in individual I2 to create child C2gen2.

In some examples, the mutation may be assigned a probability PM of occurring and the crossover may be assigned PC of occurring. For example, the sum of PM and PC may be equal to one (1). In some examples, PM may be 0.2 (e.g., 20 percent), and PC may be 0.8 (e.g., 80 percent).

The genetic algorithm may then determine fitnesses and data eyes for memory 103 for the second generation from mutation M1gen2 and children C1gen2 and C2gen2 as previously described. In some examples, the other mutations (e.g., mutation M2gen2) of second generation and/or other children of the second generation may be generated from individuals I1 and I2, such as responsive to mutation M1gen2 and/or children C1gen2 and C2gen2 resulting in a lower fitness than individuals I1 and I2. The other mutations and/or children could have different settings changed than the settings that were changed to produce mutation M1gen2 and children C1gen2 and C2gen2. For example, settings s2,3 and s2,4 from individual I2 could replace settings s1,3 and s1,4 of I1 to create child C3gen2(s1,1, s1,2, s2,3, s2,4, s1,5, . . . , s1,J), and settings s1,3 and s1,4 from individual I1 replace settings s2,3 and s2,4 in individual I2 to create child C4gen2(s2,1, s2,2, s1,3, s1,4, s2,5, . . . , s2,J). Fitnesses may be determined for mutation M2gen2 and/or children C2gen2 and C3gen2 responsive to mutation M1gen2 and/or children C1gen2 and C2gen2 resulting in a lower fitness than individuals I1 and I2.

Subsequently, third generation may be determined from the second generation using the genetic operators of mutation and crossover. For example, the third generation may include a mutation of mutation M1gen2 and/or children C1gen2 and C2gen2 and children of children C1gen2 and C2gen2. The genetic algorithm may then determine fitnesses and data eyes for memory 103 for the third generation from the mutation of mutation M1gen2 and/or children C1gen2 and C2gen2 and children of children C1gen2 and C2gen2 as previously described.

In some examples, a mutation M1gen3(s9, s1,2, s1,3, s8, s1,5, . . . , s1,J) is a of mutation M1gen2; mutation M2gen3 (s9, s2,2, s1,3, s1,4, s1,5, . . . , s1,J) is a mutation of child C1gen2; and mutation M3gen3(s1,1, s1,2, s2,3, s10, s2,5, . . . , s2,J) is a mutation of child C2gen2. Settings s2,3 and s2,4 from child C2gen2 could replace settings s1,3 and s1,4 of C1gen1 to create child C1gen3(s2,1, s2,2, s2,3, s2,4, s1,5, . . . , s1,J), and settings s1,3 and s1,4 from child C1gen2 replace settings s2,3 and s2,4 in child C2gen2 to create child C2gen3(s1,1, s1,2, s1,3, s1,4, s2,5, . . . , s2,J).

Genetic algorithm may continue to determine generations from preceding generations and fitnesses and data eyes for the determined generations until a particular condition is reached. In some examples, the fitness may increase with each subsequent generation until the fitness no longer changes for subsequent generation. For example, particular condition may be when the fitness no longer changes for subsequent generations. The particular condition may be reached, for example, when variations in the fitness for subsequent generations is less than a particular amount. A new generation may be generated from a preceding generation and a corresponding fitnesses and data eyes determined for the new generation to determine whether the new generation results in a change in the fitnesses and data eyes from the preceding generation. In some examples, a number of mutations and/or children may be generated within each generation (e.g. from the preceding generation), such as in response to other mutations and/or children within each generation resulting in a decrease in the fitness compared to the preceding generation.

In some examples, a set of settings corresponding to the particular condition may be used during normal (e.g., non-test mode-) operation of memory 103. For example, the set of settings may be applied to the PLL 132 in each of memories 104-1 to 104-N. For example, the set of settings may be fusibly applied by blowing fuses in each of memories 104-1 to 104-N.

Figure 3:
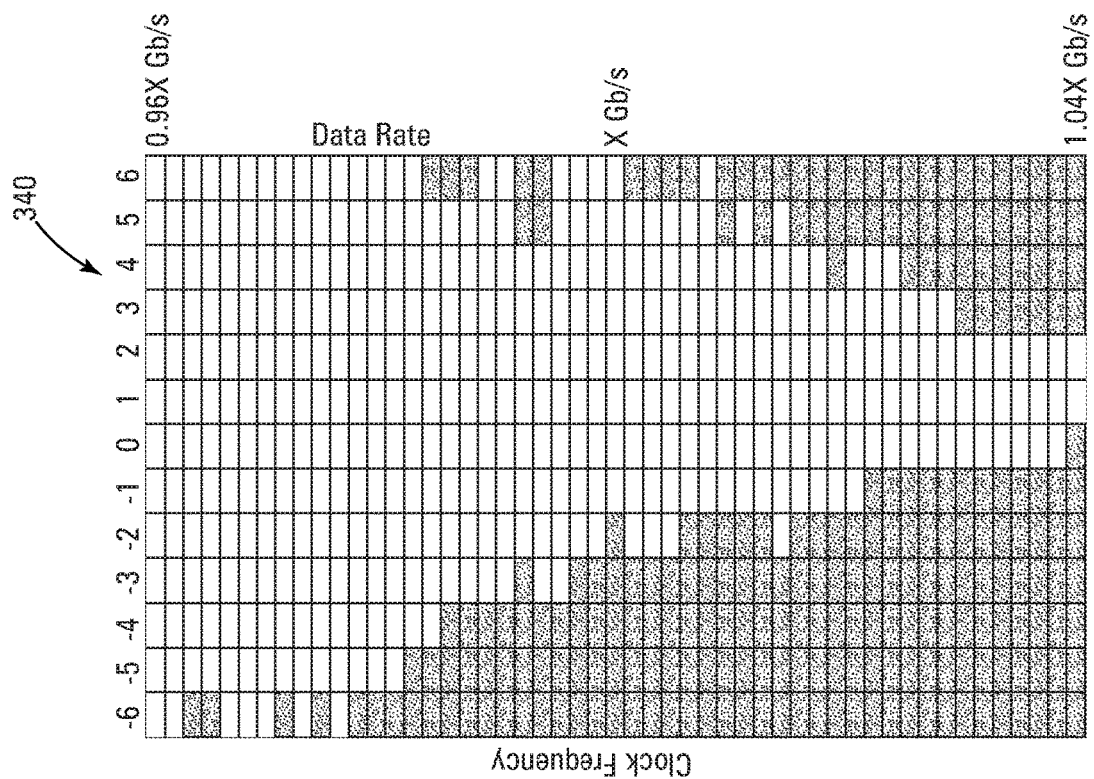
FIG. 3 illustrates a shmoo diagram obtained from clock characteristic determined in accordance with a number of embodiments of the present application.

FIG. 3 illustrates a shmoo diagram 340 for memory 103 obtained from clock characteristic (e.g., a set of settings)

determined using a genetic algorithm, in accordance with a number of embodiments of the present application. For example, shmoo diagram 340 may correspond to a set of settings that meets the particular condition (e.g., for which the fitness no longer changes). The set of settings may be fusibly applied to the PLL 132 in each memories 104-1 to 104-N, for example.

Shmoo diagram 340 is laid out in a manner similar to (e.g., the same as) shmoo diagram 240 as previously described. For example, the columns respectively correspond to different strobe timings, relative to the zero (0) column, and the rows correspond to different data clock frequencies, such that each respective entry corresponds to a respective operating point corresponding strobe offset and a data clock frequency. In FIG. 3, the unshaded blocks have zero errors and are pass points, whereas the shaded blocks have at least one error. The unshaded region corresponds to the read data eye for the test mode operation.

In some examples, shmoo diagram 240 may be generated without using a genetic algorithm, such as might be done using previous approaches. For example, shmoo diagram 240 for memory 103 may be obtained from a set of settings determined without using a genetic algorithm, such as a set of default settings. The size of data eye in shmoo diagram 340 is considerably larger than the size of the data eye in shmoo diagram 240 as a result of using the genetic algorithm. Therefore, the fitness corresponding to shmoo diagram 340 is greater than the fitness corresponding to shmoo diagram 240. For example, the fitness (e.g., the number of unshaded squares) corresponding to shmoo diagram 240 is 154, whereas the fitness corresponding to shmoo diagram is 414.

The data eye in shmoo diagram 340 is larger than the data eye in shmoo diagram 240. Note that the data eye in shmoo diagram 240 is closed for 1.0× Gb/s, whereas the data eye in shmoo diagram 340 is open at 1.04× Gb/s, meaning that memory 103 can operate at greater data rates for the clock characteristic corresponding to shmoo 340 than for the clock characteristic corresponding to shmoo 240. Moreover, memory 103 can operate over a larger range of strobe settings rates for the clock characteristic corresponding to shmoo 340 than for the clock characteristic corresponding to shmoo 240.

Although specific examples have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method, comprising:
    concurrently varying, by respective biasing circuitries of a plurality of memory devices of a memory system, a number of clock characteristics of internal clocks of the plurality of memory devices, wherein the internal clocks are based at least in part on a clock external to the plurality of memory devices, and
    wherein the number of clock characteristics include a clock frequency and a strobe offset;
    determining a first fitness of the memory system for each variation of the number of clock characteristics;
    selecting a particular variation of the number of clock characteristics based on the first fitness of the memory system for the particular variation;
    changing a setting of the internal clocks corresponding to the particular variation to generate an additional variation of the number of clock characteristics; and
    determining a second fitness of the memory system for the additional variation.

2. The method of claim 1, wherein the first and second fitnesses are expressed as a respective quantity of pass points for the memory system for a respective clock frequency and strobe offset pair.

3. The method of claim 1, wherein the first and second fitnesses are expressed as a respective size of a data eye for the memory system for a respective clock frequency and strobe offset pair.

4. The method of claim 1, wherein varying the number of clock characteristics comprises applying a number of clock settings to the internal clocks of the plurality of memory devices.

5. The method of claim 1, wherein varying the number of clock characteristics comprises applying a number of current settings to phase locked loops of the plurality of memory devices.

6. The method of claim 1, further comprising generating a respective shmoo diagram for each respective variation of the number of clock characteristics.

7. The method of claim 6, wherein generating the respective shmoo diagram comprises determining a quantity of failed bits for the memory for each entry of the respective shmoo diagram.

8. The method of claim 7, wherein each entry of the respective shmoo diagram corresponds to the strobe offset and the clock frequency.

9. The method of claim 1, wherein the additional variation of the number of clock characteristics is a mutation of the particular variation of the number of clock characteristics.

10. The method of claim 1, wherein the particular variation of the number of clock characteristics is a first particular variation of the number of clock characteristics, and
    wherein the method further comprises:
        selecting a second particular variation of the number of clock characteristics based on the second fitness of the memory system for the second particular variation of the number of clock characteristics; and
        replacing the setting corresponding to the first particular variation of the number of clock characteristics with a setting corresponding to the second particular variation of the number of clock characteristics.

11. The method of claim 10, wherein the additional variation of the number of clock characteristics is a first additional variation of the number of clock characteristics, and
    wherein the method further comprises replacing a setting corresponding to the second particular variation of the number of clock characteristics with a setting corresponding to the first particular variation of the number of clock characteristics to generate a second additional variation of the number of clock characteristics.

12. An apparatus, comprising:
    a plurality of memory devices configured to apply respective groups of settings to respective internal clocks of the plurality of memory devices concurrently, wherein the respective groups of settings include a clock frequency and a strobe offset; and
    a processor coupled to the plurality of memory devices, wherein the internal clocks of the plurality of memory devices are based at least in part on a clock of the processor, and wherein the processor is configured to:
provide the respective groups of settings selected from a plurality of groups of settings;
determine, for each of the respective groups of settings applied to the plurality of memory devices, a respective fitness of the plurality of memory devices; and
select a particular one of the respective groups of settings based on the corresponding determined respective fitness.

13. The apparatus of claim 12, wherein the plurality of memory devices are configured to change a setting of one of the respective groups of settings to a randomly selected setting.

14. The apparatus of claim 12, wherein the plurality of memory devices are configured to change a setting of a first one of the respective groups of settings to a setting of a second one of the respective groups of settings.

15. The apparatus of claim 14, wherein the plurality of memory devices are configured to change a different setting of the second one of the respective groups of settings to a different setting of the first one of the respective groups of settings.

16. An apparatus, comprising:
a plurality of memory devices; and
a processor coupled to the plurality of memory devices and configured to:
execute a genetic algorithm to yield a respective generation of current settings based on application of a genetic operator on a respective preceding generation of current settings; and
execute the genetic algorithm until a variation of a respective fitness of the plurality of memory devices based on the respective generation of current settings relative to a respective preceding fitness of the plurality of memory devices based on the respective preceding generation of current settings is a particular amount;

wherein each of the plurality of memory devices is configured to:
receive each respective generation of current settings from the processor; and
perform a respective set of operations in response to receiving each respective generation of current settings; and wherein the processor is further configured to determine the respective fitness of the plurality of memory devices for each respective set of operations.

17. The apparatus of claim 16, wherein the genetic operator is a mutation or a crossover.

18. The apparatus of claim 16, wherein the processor is further configured to execute the genetic algorithm to yield at least one of a child or a mutation of the preceding generation of current settings as the respective generation of current settings.

19. The apparatus of claim 16, wherein the processor is configured to generate current settings for a respective previous generation based at least in part on a particular group of current settings determined to have a best fitness.

* * * * *